(12) United States Patent
Yamaji et al.

(10) Patent No.: US 9,412,732 B2
(45) Date of Patent: Aug. 9, 2016

(54) SEMICONDUCTOR DEVICE

(71) Applicant: FUJI ELECTRIC CO., LTD., Kawasaki-shi (JP)

(72) Inventors: Masaharu Yamaji, Matsumoto, Nagano (JP); Hiroshi Kanno, Matsumoto, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/882,451

(22) Filed: Oct. 13, 2015

(65) Prior Publication Data

US 2016/0043067 A1 Feb. 11, 2016

Related U.S. Application Data

(63) Continuation of application No. PCT/JP2014/073578, filed on Sep. 5, 2014.

(30) Foreign Application Priority Data

Oct. 7, 2013 (JP) ................. 2013-210548

(51) Int. Cl.
*H01L 27/02* (2006.01)
*H01L 27/092* (2006.01)
(Continued)

(52) U.S. Cl.
CPC .......... *H01L 27/0285* (2013.01); *H01L 21/761* (2013.01); *H01L 27/092* (2013.01); *H01L 27/0928* (2013.01); *H01L 29/0642* (2013.01)

(58) Field of Classification Search
CPC .............. H01L 21/761; H01L 27/0928; H01L 29/0642; H01L 27/092; H01L 27/0285
USPC ................................. 257/357, 355
See application file for complete search history.

(56) References Cited

U.S. PATENT DOCUMENTS 5,894,156 A 4/1999 Terashima et al.
6,127,857 A 10/2000 Ogawa et al.
(Continued)

FOREIGN PATENT DOCUMENTS

JP H06-37281 A 2/1994
JP H11-26598 A 1/1999
(Continued)

OTHER PUBLICATIONS

Tatsuhiko Fujihira et al., "Proposal of New Interconnection Technique for Very High-Voltage IC's", Japanese Journal of Applied Physics, vol. 35, Part 1, No. 11, Nov. 1996, pp. 5655-5663.
(Continued)

*Primary Examiner* — Walter H Swanson
(74) *Attorney, Agent, or Firm* — Rabin & Berdo, P.C.

(57) ABSTRACT

In a high-side region, a first n-diffusion region, in which a PMOS constituting a gate drive circuit is formed, and a second n-diffusion region, in which a p-diffusion region is formed, are provided on a surface layer of a $p^{--}$ substrate. An NMOS constituting a gate drive circuit is formed in the p-diffusion region. A p-type isolation diffusion region at ground potential is provided between the first n-diffusion region and the second n-diffusion region, and the first re-diffusion region and the second n-diffusion region are electrically isolated. The first n-diffusion region is connected to a VB terminal at a power source potential. The second n-diffusion region is connected to a terminal at a reference or floating potential. The p-diffusion region is connected to a VS terminal at a reference potential. Accordingly, it is possible to suppress parasitic operation due to a surge, without using external components, and without element breakdown.

15 Claims, 10 Drawing Sheets

(51) Int. Cl.
*H01L 29/06* (2006.01)
*H01L 21/761* (2006.01)

(56) References Cited

U.S. PATENT DOCUMENTS

| | | |
|---|---|---|
| 2003/0232490 A1 | 12/2003 | Hayashi |
| 2003/0234427 A1 | 12/2003 | Kono |
| 2004/0189353 A1 | 9/2004 | Hatade et al. |
| 2011/0176248 A1 | 7/2011 | Nakahara |
| 2012/0068761 A1* | 3/2012 | Banerjee ............ H01L 23/5252 327/525 |
| 2012/0235712 A1 | 9/2012 | Yamaji |

FOREIGN PATENT DOCUMENTS

| | | |
|---|---|---|
| JP | 2003-258120 A | 9/2003 |
| JP | 2004-031411 A | 1/2004 |
| JP | 2004-296831 A | 10/2004 |
| JP | 2006-005184 A | 1/2006 |
| JP | 2007-123706 A | 5/2007 |
| JP | 3917211 B2 | 5/2007 |
| JP | 2009-206119 A | 9/2009 |
| JP | 2011-035374 A | 2/2011 |
| JP | 2012-519371 A | 8/2012 |

OTHER PUBLICATIONS

Jonathan Adams, "Bootstrap Component Selection for Control IC's", International Rectifier Design Tip, DT 98-2a, Apr. 9, 2001, pp. 1-4.

* cited by examiner

SEMICONDUCTOR DEVICE

CROSS-REFERENCE TO RELATED APPLICATION

This application is a Continuation of International Application PCT/JP2014/073578 filed on Sep. 5, 2014, and claims priority to, Japanese Patent Application No. 2013-210548, filed on Oct. 7, 2013, the contents of both of which are entirely incorporated herein by reference for all purposes.

BACKGROUND

1. Technical Field

This disclosure relates to a semiconductor device.

2. Description of Related Art

A transistor or opto-coupler electrically insulated between the input side and the output side is commonly known in the prior art as a semiconductor element for use in gate driving of a switching element, such as an IGBT (insulated-gate bipolar transistor), which constitutes a power conversion bridging circuit in an industrial inverter. Furthermore, in recent years, high-voltage ICs (HVICs) in which the input side and the output side are not electrically insulated, have been used, principally in low-capacity inverter applications, in order to lower costs (see, for example, T. Fujihira et al., Proposal of New Interconnection Technique for Very High-Voltage IC's, Japanese Journal of Applied Physics, November 1996, Vol. 35 (First edition), No. 11, pp. 5655-5663).

In order to manufacture a high-voltage IC at low cost, it is suitable to apply an IC process, which enables the use of inexpensive bulk substrates, and employs self-isolation technology that does not require a special element isolation process. Fujihira et al., for example, discloses a high-voltage IC, which is fabricated (manufactured) by this self-isolated IC process. The structure of a high-voltage IC manufactured by the self-insulated IC process will now be described.

FIG. 9 is a plan diagram showing a schematic view of the plan structure of a conventional high-voltage IC. FIG. 10 is a cross-sectional diagram showing a cross-sectional structure along cross-section AA-AA' in FIG. 9. FIG. 11 is a circuit diagram showing an equivalent circuit of the high-voltage IC in FIG. 10.

As shown in FIG. 9, the high-voltage IC 200 is provided with a high-side drive circuit 210, a level shifter 214, and a control circuit 215. The high-side drive circuit 210 is provided with a gate drive circuit, a level-shift resistance, and the like. The high-side drive circuit 210 is arranged in a high-side region 220. The periphery of the high-side region 220 is surrounded by a high-voltage isolation region 224. The high-side region 220 is electrically isolated from a low-side region 225 by the high-voltage isolation region 224. The level shifter 214 is arranged in the high-voltage isolation region 224. A level-shift resistance 217 is connected between the VB terminal and the level shifter 214 as shown in FIG. 11.

Referring back to FIG. 9, the periphery of the high-voltage isolation region 224 is surrounded by the low-side region 225. A control circuit 215 which controls the high-side drive circuit 210 is arranged in the low-side region 225. The low-side region 225 is the portion apart from the high-side region 220, the high-voltage isolation region 224 and the level shifter 214. The gate drive circuit which forms the high-side drive circuit 210 is includes a CMOS (complementary metal-oxide semiconductor) in which a high-side p-channel MOSFET (p-channel metal-oxide semiconductor field-effect transistor, called "PMOS" below) 212, and an n-channel MOSFET (called "NMOS" below) 213, are connected in complementary fashion as shown in FIG. 11.

In FIG. 10, a high-voltage IC made by a self-isolated IC process, a lateral-type PMOS 212 of the high-side drive circuit 210 is formed in an n diffusion region 202 which is provided selectively on the surface layer of a $p^{--}$ bulk substrate 201. A p diffusion region 203 is formed to a comparatively shallow depth inside the n diffusion region 202, and a lateral-type NMOS 213 is formed in this p diffusion region 203. The n diffusion region 202 is connected to a VB terminal which is the highest electric potential of the high-side drive circuit 210. The p diffusion region 203 is connected to a VS terminal which is the lowest electric potential of the high-side drive circuit 210. The potential difference between the VB terminal and the VS terminal is the power source voltage of the high-side drive circuit 210, which is approximately 15 V, for example.

A $p^-$ region 204 is provided inside the low-side region 225 on the portion of the surface layer of the $p^{--}$ bulk substrate 201 to the outside of the n diffusion region 202. The $p^{--}$ bulk substrate 201 and the $p^-$ region 204 are connected to a GND terminal at ground potential (0 V, for example). An $n^-$ low-concentration diffusion region 205 constituting the high-voltage isolation region 224 is provided between the n diffusion region 202 and the $p^-$ region 204. When the potential of the high-side region 220 is raised to a high voltage of 600 V or more above the low-side region 225, then the pn junction between the $n^-$ low-concentration diffusion region 205 and the $p^-$ region 204 is reverse-biased, whereby the $n^-$ low-concentration diffusion region 205 becomes depleted and the voltage resistance in the lateral direction (the direction parallel to the main surface of the substrate) is maintained.

As shown in FIG. 11, the high-voltage IC 200 is connected to a power conversion bridge circuit, for example, and drives a first and a second MOSFET 101, 102, which constitute one phase of the power conversion bridge circuit. The first and second MOSFETs 101, 102 are connected in series between a high-voltage main power source (anode side) Vdc and a ground potential GND which is the cathode side of the main power source. The VS terminal is connected to a contact point 105 between the first MOSFET 101 and the second MOSFET 102. The contact point 105 is the output point of the bridge circuit that is constituted by the first and second MOSFETs 101 and 102. Reference numerals 103 and 104 are FWD (free-wheeling diodes).

The operation of the high-voltage IC 200 is described with reference to an example for driving the first MOSFET 101 on the high side of the power conversion bridge circuit. The high-side drive circuit 210 takes the potential of the contact point 105 where the VS terminal is connected as a reference potential VS and operates at a potential between the reference potential VS and the power source potential VB, which is the highest potential of the high-side drive circuit 210. When a boot-strap circuit is used, the power source potential VB of the high-side drive circuit 210 is higher than the reference potential VS by an amount corresponding to the voltage of the boot-strap capacitor. The control circuit 215 operates by taking the ground potential GND as a reference, and generates an on/off control signal referenced to GND for switching the first MOSFET 101 on and off.

The GND-referenced on/off control signal is converted to an on/off control signal referenced to VS, by the level shifter 214, and is transmitted to the high-side drive circuit 210. The on/off signal input to the high-side drive circuit 210 is input to the gate of the first MOSFET 101 via the gate drive circuit 211. The first MOSFET 101 is switched on and off on the basis of this on/off signal. Due to the first MOSFET 101 switching on and off on the basis of the on/off signal from the control circuit 215 transmitted via the level shifter 214 in this way, the potential of the VS terminal varies from 0 V (GND) to several hundred V (Vdc) in combination with the on/off switching of the second MOSFET 102.

A conventional high-voltage IC of this kind has been proposed in which the size of the device is reduced without increasing manufacturing costs, by setting the high-voltage isolation region between a level-shift n-channel MOSFET and an isolated region to be a region where a p-type substrate region (or p diffusion layer) made from a p-type substrate is exposed on the front surface of the substrate, instead of a p diffusion region and a resurf region peripheral to same as in the prior art (see, for example, Japanese Patent No. 3917211).

In Japanese Patent No. 3917211, the potential difference between n diffusion regions, which are divided by the high-voltage isolation region is used as a signal voltage for level shifting. Therefore, one of the n diffusion regions (isolated regions) which is divided by the high-voltage isolation region is set to the power source potential, and the other n diffusion region is set to the drain potential of the level-shift n-channel MOSFET. The drain potential of the level-shift n-channel MOSFET becomes the power source potential of the high-voltage IC when the level-shift re-channel MOSFET is off, and becomes a potential that is lower than the power source potential by a voltage value obtained by multiplying the level-shift resistance by the current value of the level-shift n-channel MOSFET, when the level-shift re-channel MOSFET is on.

Furthermore, the following device has been proposed as a conventional high-voltage IC. Provided on a p⁻ silicon substrate are: an n⁻ region surrounded by a p⁻ well region, a drain n⁺ region connected to a drain electrode, a p base region surrounding the drain n⁺ region and separated from the drain n⁺ region, and a source n⁺ region disposed inside the p base region. The n⁻ region is isolated from the first n⁻ region and the second n⁻ region by a p⁻ region which passes through the n⁻ region and reaches the p⁻ silicon substrate. A drain n⁺ region is provided in the first n⁻ region. The first n⁻ region has a floating potential (see Japanese Translation of PCT Application No. 2012-519371, for example).

SUMMARY

However, in the high-voltage IC 200 of FIG. 10, which is manufactured by a self-isolated IC process, a parasitic pnp bipolar transistor (not illustrated), in which the p⁺ diffusion region of the PMOS 212 is the emitter, the n diffusion region 202 is the base, and the p⁻⁻ bulk substrate 201 is the collector, and/or a parasitic pnp bipolar transistor 218, in which the p diffusion region 203 is the emitter, the n diffusion region 202 is the base and the p⁻⁻ bulk substrate 201 is the collector, are formed inside the high-side region 220. In the parasitic pnp bipolar transistor (not illustrated) in which the p⁺ diffusion region of the PMOS 212 is the emitter, the n diffusion region 202 is the base and the p⁻⁻ bulk substrate 201 is the collector, the hFE (direct current amplification ratio) is small and thermal runway is not liable to occur because the n diffusion region 202 which forms the base of the transistor has a large depth.

In contrast to this, the hFE is larger and thermal runaway occurs more readily in the parasitic pnp bipolar transistor 218, since the depth of the p diffusion region 203 which forms the emitter is greater than the depth of the p⁺ diffusion region of the PMOS 212, and the base width (the thickness of the portion of the n diffusion region 202 sandwiched between the p diffusion region 203 and the p⁻⁻ bulk substrate 201) is narrow. The base, emitter and collector of the parasitic pnp bipolar transistor 218 which has this narrow base width are respectively connected to the VB terminal, the VS terminal and the GND terminal.

During normal operation, the power source potential VB of the high-voltage IC 200 is higher than the reference potential VS, and therefore the parasitic pnp bipolar transistor 218 does not operate. However, if the power source potential VB falls to 0.6 V, which is the diffusion potential of the silicon pn junction, or more, compared to the reference potential VS, due to a negative voltage surge, in other words, if the relationship VB<(VS−0.6 (V)) occurs between the potentials, then the pn junction between the p diffusion region 203 (emitter) and the n diffusion region 202 (base) is forward-biased and the parasitic pnp bipolar transistor 218 having a narrow base width switches on. Consequently, there is a problem in that a large current flows between the VS terminal, to which a high voltage (equal to the high-potential-side potential Vdc or less) is applied, and the GND terminal, and the generation of heat caused by the large current leads to breakdown of the high-voltage IC 200.

In order to avoid element breakdown due to a negative voltage surge between the VB terminal and VS terminal in this way, normally, as proposed in Jonathan Adams, Bootstrap Component Selection for Control IC's, [online], International Rectifier Japan, retrieved 10 Jun. 2013 via Internet (www.irf-japan.com/technical-info/designtp/dt98-2j.pdf), a bypass capacitor connected as an external component outside the p⁻⁻ bulk substrate 201 is arranged between the VB and VS terminals. However, there are problems in that it may not be possible to connect a bypass capacitor due to the layout design and/or cost restrictions. Further, it may not be possible to arrange the bypass capacitor close to the high-voltage IC 200 due to layout design restrictions, and sufficient beneficial effects cannot be obtained due to arrangement of the bypass capacitor at a position distanced from the high-voltage IC 200.

It is an object of this disclosure to provide a semiconductor device which can prevent breakdown due to a surge, in order to eliminate the problems described above.

In order to eliminate the abovementioned problems and achieve the objects of the present disclosure, the semiconductor device according to this disclosure includes: a first semiconductor region of a second conductor type connected to a first potential, and disposed on a surface layer of a semiconductor layer of a first conductor type; a second semiconductor region of the second conductor type connected to one of a second potential lower than the first potential and a floating potential, and disposed on the surface layer of the semiconductor layer; a third semiconductor region of the first conductor type connected to the second potential, and disposed inside the second semiconductor region; a circuit which takes the second potential as a reference potential and operates at a potential between the reference potential and the first potential, the circuit being disposed in the first semiconductor region and the third semiconductor region; and an isolation region disposed between the first semiconductor region and the second semiconductor region, and electrically isolates the first semiconductor region from the second semiconductor region.

Furthermore, in the semiconductor device according to the present disclosure as described above, the semiconductor layer is connected to a third potential lower than the first potential; and the isolation region is a semiconductor region of the first conductor type which is in contact with the first semiconductor region and the second semiconductor region, and is electrically connected to the semiconductor layer.

Furthermore, in the semiconductor device according to the present disclosure as described above, the isolation region includes: a trench between the first semiconductor region and the second semiconductor region, the trench passing through the first semiconductor region and the second semiconductor region and reaching the semiconductor layer; and an insulator layer buried inside the trench.

Furthermore, in the semiconductor device according to the present disclosure as described above, wherein the circuit comprises a gate drive circuit which drives a first transistor of an external circuit in which the first transistor on a high-potential side and a second transistor on a low-potential side are connected.

Furthermore, in the semiconductor device according to the present disclosure as described above, the second potential is the potential of a contact point between the first transistor and the second transistor.

Furthermore, in the semiconductor device according to the present disclosure as described above, depletion layers respectively extending inside the isolation region from pn junctions between the isolation region of the first semiconductor type, and the first semiconductor region and the second semiconductor region, the depletion layers connecting with each other when the second potential is higher than the third potential by a prescribed potential.

Furthermore, in the semiconductor device according to the present disclosure as described above, a CMOS circuit is disposed in the circuit, the CMOS circuit including a MOSFET in a channel of the first conductor type disposed in the first semiconductor region, and a MOSFET in a channel of the second conductor type disposed in the third semiconductor region.

According to the disclosure as described above, since the first semiconductor region at the first potential, and the second semiconductor region, in which the third semiconductor region at the second potential is disposed, are isolated electrically by the insolation region, and the second semiconductor region is set to the second potential or the floating potential, then even if the first potential falls below the second potential due to a negative voltage surge, current does not flow between the third semiconductor region at the second potential and the semiconductor layer at the third potential. Therefore, the parasitic pnp bipolar transistor having a narrow base width, in which the third semiconductor region is the emitter, the first semiconductor region is the base, and the semiconductor layer is the collector, does not operate. Consequently, it is possible to prevent the element from undergoing breakdown due to parasitic operation caused by a negative voltage surge.

By means of the semiconductor device according to the present disclosure, a beneficial effect is obtained in that it is possible to suppress parasitic operation due to a surge, without using external components, and the element can be prevented from undergoing breakdown.

DETAILED DESCRIPTION

Figure 1:
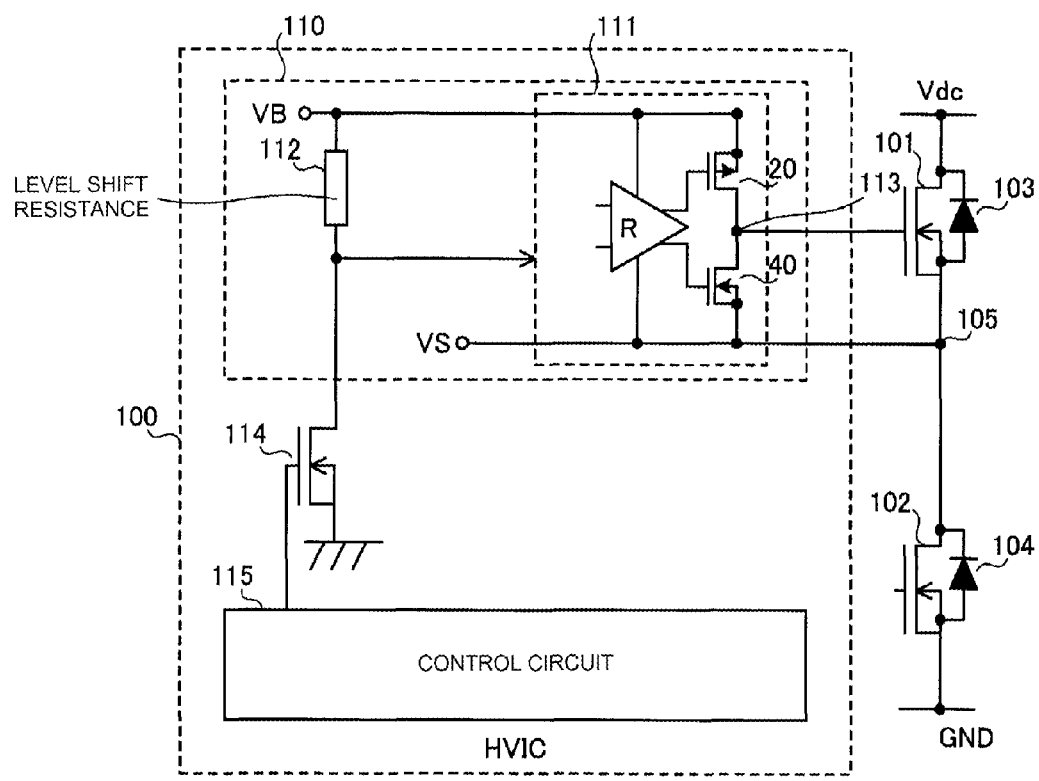
FIG. 1 is a circuit diagram showing an equivalent circuit of a high-voltage IC according to a first embodiment.

A semiconductor device according to illustrative embodiments are described below with reference to the accompanying drawings. In the present description and the accompanying drawings, a layer or region which is prefixed with n or p means that electrons or holes are the majority carrier in the layer or region in question, respectively. Furthermore, a + or − sign attached to the n or p means that the layer or region in question has a high impurity concentration or low impurity concentration, respectively, compared to a layer or region to which the sign is not attached. In the following description of the embodiments and the accompanying drawings, similar parts of the composition are labelled with the same reference numerals, and repeated description thereof is omitted.

(First Embodiment)

The structure of a semiconductor device according to a first embodiment is described here with reference to a high-voltage IC that drives a power conversion bridge circuit. FIG. 1 is a circuit diagram showing an equivalent circuit of a high-voltage IC according to the first embodiment. As shown in FIG. 1, first and second MOSFETs 101, 102 (first and second insulated-gate transistors) constituting a power conversion bridge circuit (external circuit) are connected in series between the high-voltage main power source (anode side) Vdc, and the ground potential GND, which is connected to the cathode side of this main power source. The VS terminal is connected to a contact point 105 between the first MOSFET 101 and the second MOSFET 102. The contact point 105 is the output point of the power conversion bridge circuit, and is connected to a motor, or the like, which is a load. First and second IGBTs may be arranged in the power conversion bridge circuit, instead of the first and second MOSFETs 101, 102.

A high-voltage IC 100 is provided with a high-side drive circuit 110, a level shifter 114, and a control circuit 115, and drives the first MOSFET 101 on the high side, of the first and second MOSFETs 101, 102 which constitute one phase of the power conversion bridge circuit. The high-side drive circuit 110 takes the potential of the VS terminals as a reference potential (second potential) VS and operates at a potential between the reference potential VS and a power source potential (first potential) VB, which is approximately 15 V higher than the reference potential, for example. The power source potential VB is the highest potential of the high-side drive circuit 110. The reference potential VS is the lowest potential of the high-side drive circuit 110. More specifically, the high-side drive circuit 110 is, for example, provided with a gate drive circuit 111 and a level-shift resistance 112, and the like.

The gate drive circuit 111 is provided with a CMOS circuit in which a p-channel MOSFET (PMOS) 20 on the high side and an n-channel MOSFET (NMOS) 40 are connected in complementary fashion. The source of the PMOS 20 is connected to the VB terminal of the power source potential VB, and the drain of the PMOS 20 is connected to the drain of the NMOS 40. The source of the NMOS 40 is connected to the VS terminal of the reference potential VS. The contact point 113 between the PMOS 20 and the NMOS 40 is connected to the gate of the first MOSFET 101. Reference numerals 103 and 104 are FWD (free-wheeling diodes).

A control circuit 115 controls the high-side drive circuit 110. More specifically, the control circuit 115 operates by taking the ground potential GND as a reference, and generates an on/off control signal referenced to GND, for switching the first MOSFET 101 on and off. The level shifter 114 is constituted by a MOSFET, for example, and converts the GND-referenced on/off control signal generated by the control circuit 115 into a VS-referenced on/off control signal. A level-shift resistance 112 is connected between the VB terminal and the level shifter 114.

Figure 2:
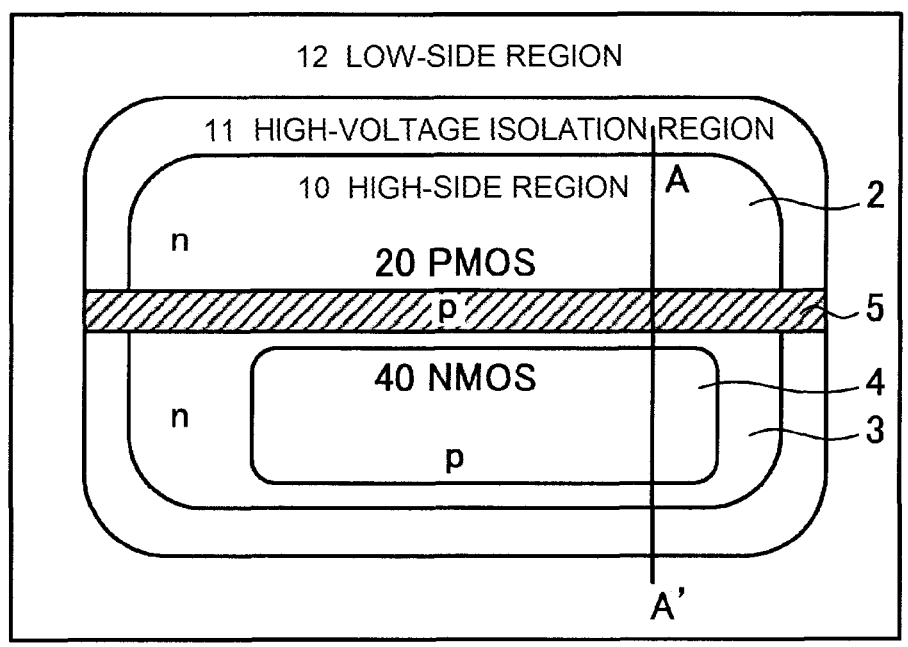
FIG. 2 is a plan diagram showing a schematic view of the plan structure of a high-voltage IC according to the first embodiment.

Next, the plan structure of the high-voltage IC 100 according to the first embodiment will be described. FIG. 2 is a plan diagram showing a schematic view of the plan structure of the high-voltage IC according to the first embodiment. As shown in FIG. 2, a first n diffusion region (first semiconductor region) 2 and a second n diffusion region (second semiconductor region) 3 are disposed in a high-side region 10. A PMOS 20 included in the gate drive circuit 111 of FIG. 1 is arranged in the first n diffusion region 2. A p diffusion region (third semiconductor region) 4 is arranged inside the second n diffusion region 3. An NMOS 40 included in the gate drive circuit 111 of FIG. 1 is arranged in the p diffusion region 4. A p-type isolation diffusion region (isolation region: first conductor-type semiconductor region) 5 is provided between the first n diffusion region 2 and the second n diffusion region 3, and extends in a linear shape, for example, so as to isolate the first n diffusion region 2 and the second n diffusion region 3.

A high-voltage isolation region 11 is arranged so as to surround the periphery of the high-side region 10. A level shifter (not illustrated), for example, is arranged in the high-voltage isolation region 11. A low-side region 12 is arranged at the periphery of the high-voltage isolation region 11 so as to surround the high-voltage isolation region 11. The high-voltage isolation region 11 has a function of electrically isolating the high-side region 10 and the low-side region 12. The high-voltage isolation region 11 may be isolated between the first n diffusion region 2 side and the second n diffusion region 3 side, by the p-type isolation diffusion region 5 which extends from the high-side region 10 to the low-side region 12. A control circuit (not illustrated), or the like, is arranged in the low-side region 12. The low-side region 12 is the portion apart from the high-side region 10, the high-voltage isolation region 11 and the level shifter.

Figure 3:
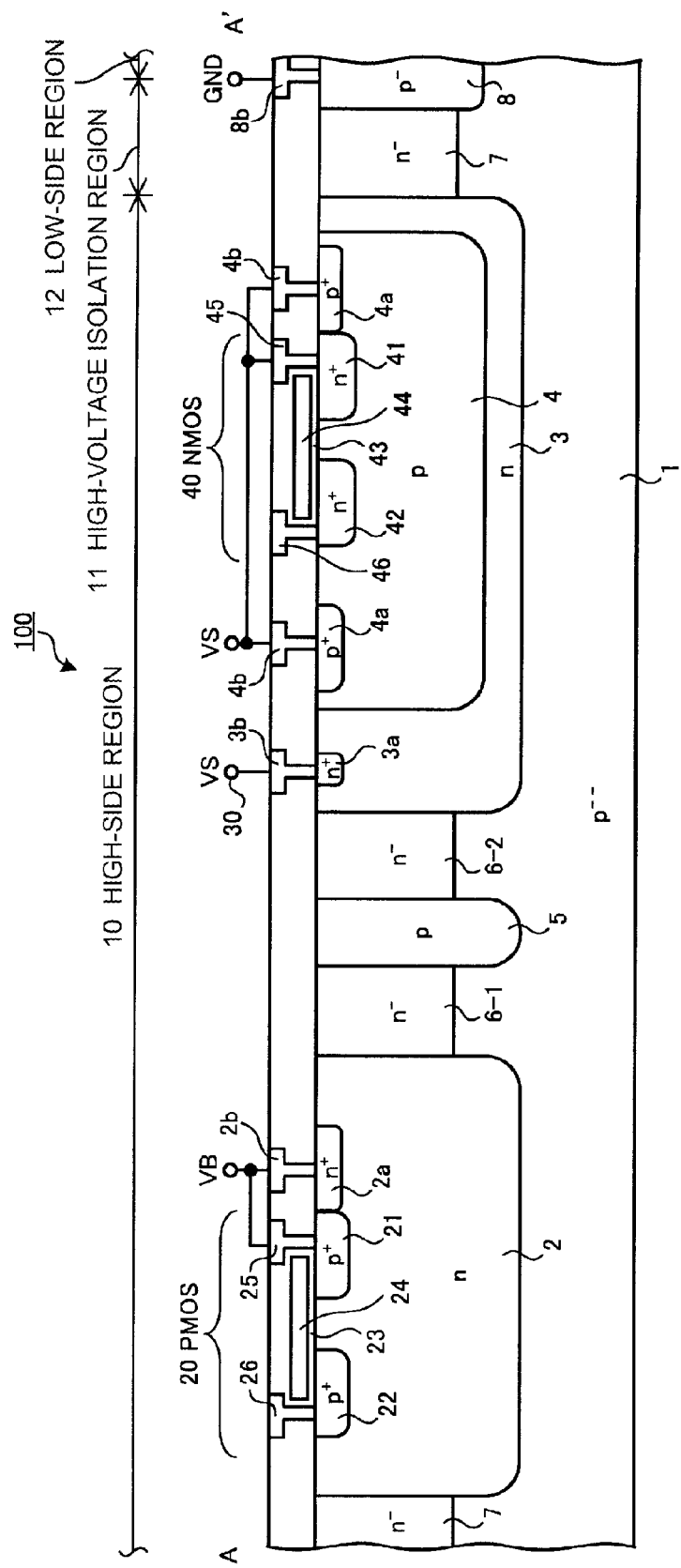
FIG. 3 is a cross-sectional diagram showing a cross-sectional structure along cross-section A-A' in FIG. 2.
Figure 8:
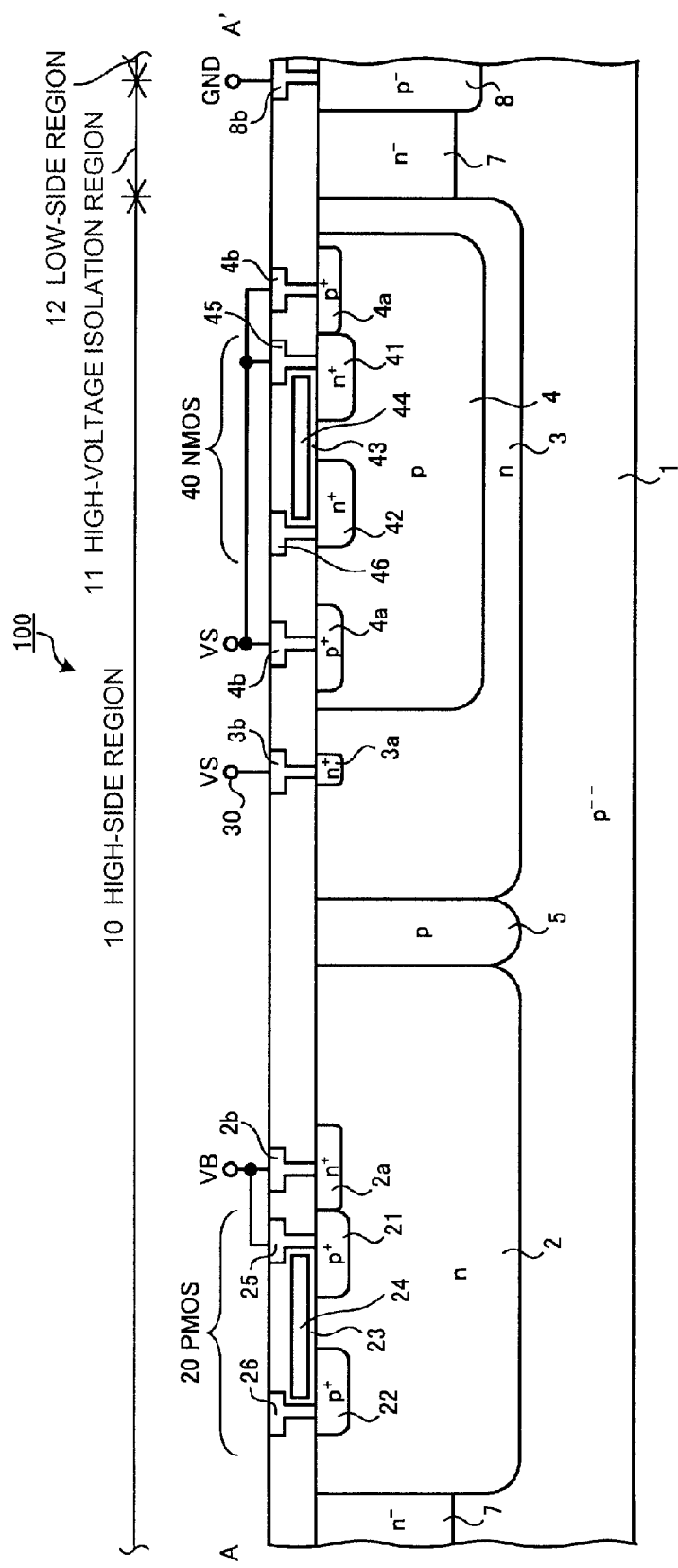
FIG. 8 is a cross-sectional diagram showing a further example of a cross-sectional structure along cross-section A-A' in FIG. 2.
Figure 9:
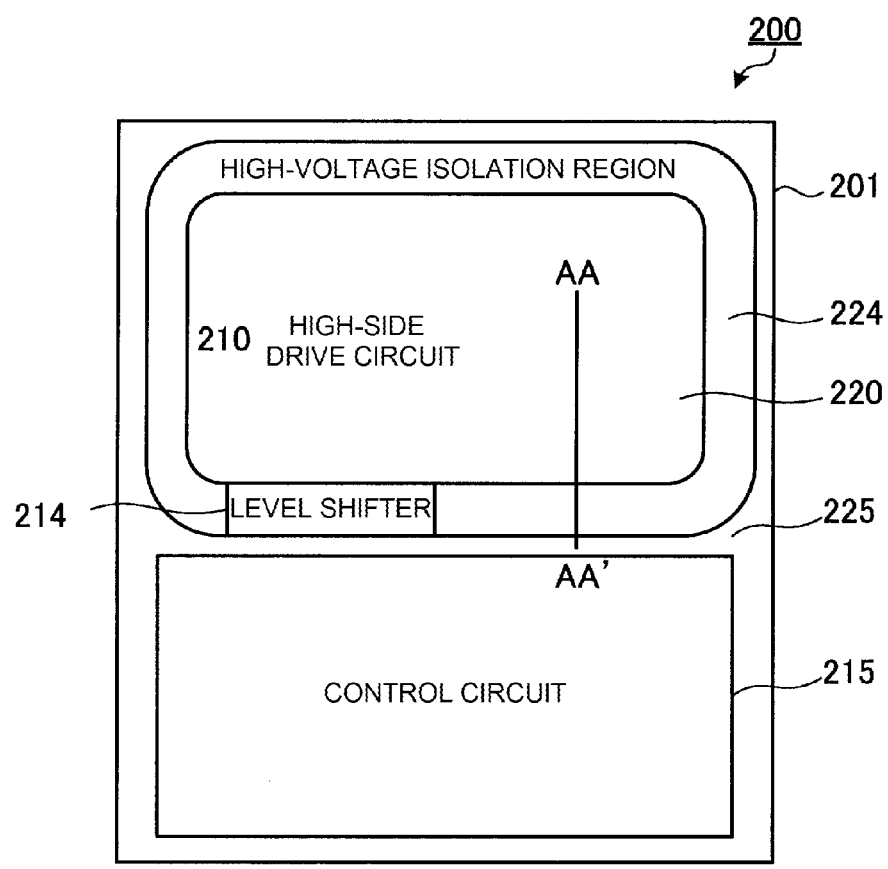
FIG. 9 is a plan diagram showing a schematic view of the plan structure of a conventional high-voltage IC.

Next, the cross-sectional structure of the high-voltage IC 100 according to the first embodiment will be described. FIG. 3 is a cross-sectional diagram showing a cross-sectional structure along cross-section A-A' in FIG. 2. FIG. 8 is a cross-sectional diagram showing a further example of a cross-sectional structure along cross-section A-A' in FIG. 2. FIG. 3 and FIG. 8 show a cross-sectional structure along cross-section A-A' which traverses the first n diffusion region 2, the p-type isolation diffusion region 5 and the second n diffusion region 3. As shown in FIG. 3, the high-voltage IC 100 has an element isolation structure which is fabricated (manufactured) by a self-isolated IC process on a p$^{--}$ substrate 1. The p$^{--}$ substrate 1 is at a ground potential (third potential) GND, for example, which is lower than the power source potential VB which is the power source potential of the high-side drive circuit 110. In the high-side region 10, the first n diffusion region 2 is provided selectively on the surface layer of the front surface of the p$^{--}$ substrate 1.

A lateral-type PMOS 20 included in the gate drive circuit 111 of FIG. 1 is formed in the first n diffusion region 2. The PMOS 20 has a general element structure comprising a MOS gate structure (an insulated gate comprising a metal-oxide semiconductor), including a p$^+$ source region 21, a p$^+$ drain region 22, a gate insulation film 23, a gate electrode 24, a source electrode 25 and a drain electrode 26, and the like. The source electrode 25 of the PMOS 20 is connected to the VB terminal of the power source potential VB of the high-side drive circuit 110. A first n diffusion region 2 is connected to a contact electrode 2b via an n$^+$ high-concentration region 2a which is provided inside the first n diffusion region 2. The contact electrode 2b is connected to the VB terminal.

Furthermore, in the high-side region 10, a second n diffusion region 3 is provided selectively on the surface layer of the front surface of the p$^{--}$ substrate 1, separately from the first n diffusion region 2. The second n diffusion region 3 is connected to a contact electrode 3b via an n$^+$ high-concentration region 3a which is provided inside the second n diffusion region 3. The contact electrode 3b is connected to a terminal 30 at the reference potential VS of the high-side drive circuit 110. The terminal 30 may have a floating potential. A p diffusion region 4 is provided to a relatively shallow depth inside the second n diffusion region 3. A lateral-type NMOS 40 included in the gate drive circuit 111 of FIG. 1 is formed in the p diffusion region 4.

The NMOS 40 has a general element structure comprising a MOS gate structure including an n$^+$ source region 41, an n$^+$ drain region 42, a gate insulation film 43, a gate electrode 44, a source electrode 45 and a drain electrode 46, and the like. The source electrode 45 of the NMOS 40 is connected to the VS terminal. The p diffusion region 4 is connected to a contact electrode 4b via a p$^+$ high-concentration region 4a which is provided inside the p diffusion region 4. The contact electrode 4b is connected to the VS terminal. Furthermore, the p$^+$ high-concentration region 4a and the contact electrode 4b are provided at the outer periphery of the p diffusion region 4 and surround the NMOS 40.

The p-type isolation diffusion region 5 is provided between the first n diffusion region 2 and the second n diffusion region 3. The diffusion depth of the p-type isolation diffusion region 5 may be approximately the same as the diffusion depth of the first and second n diffusion regions 2, 3, for example, or may be greater than the diffusion depth of the first and second n diffusion regions 2, 3. The p-type isolation diffusion region 5 lies in contact with the p$^{--}$ substrate 1 and is at ground potential GND when the high-voltage IC 100 is off. Instead of the p-type isolation diffusion region 5, the p$^{--}$ substrate 1 may be set as the portion which is sandwiched between the first n diffusion region 2 and the second n diffusion region 3, and this portion of the p$^{--}$ substrate 1 which is sandwiched between the first n diffusion region 2 and the second n diffusion region 3 may be exposed on the front surface side.

An n$^-$ low-concentration diffusion region 6-1 is provided between the p-type isolation diffusion region 5 and the first n diffusion region 2. The n$^-$ low-concentration diffusion region 6-1 lies in contact with the first n diffusion region 2 and is connected to the VB terminal via the first n diffusion region 2. An n$^-$ low-concentration diffusion region 6-2 is provided between the p-type isolation diffusion region 5 and the second n diffusion region 3. The n⁻ low-concentration diffusion region 6-2 lies in contact with the second n diffusion region 3 and is connected to the VS terminal via the second n diffusion region 3. The diffusion depth of the n⁻ low-concentration diffusion regions 6-1, 6-2 may be approximately the same as the diffusion depth of the first and second n diffusion regions 2, 3, for example, or may be less than the diffusion depth of the first and second n diffusion regions 2, 3.

As described above, normally, the power source potential VB is 15 V, for example, higher than the reference potential VS. Therefore, inside the p-type isolation diffusion region 5, depletion layers extend respectively from the pn junction between the p-type isolation diffusion region 5 and the n⁻ low-concentration diffusion region 6-1, and from the pn junction between the p-type isolation diffusion region 5 and the n⁻ low-concentration diffusion region 6-2 (these junctions are referred to below as the pn junctions peripheral to the p-type isolation diffusion region 5). Here, the widths and/or impurity concentrations of each of the diffusion regions, such as the first and second n diffusion regions 2, 3, the p-type isolation diffusion region 5 and the n⁻ low-concentration diffusion regions 6-1, 6-2, are set so as to prevent avalanche breakdown of the pn junctions peripheral to the p-type isolation diffusion region 5. The width of the diffusion regions means the width of each diffusion region in a direction along the cross-section A-A'.

In other words, the width and/or impurity concentration of each diffusion region is set so that the depletion layers which extend respectively inside the p-type isolation diffusion region 5 from the pn junction with the n⁻ low-concentration diffusion region 6-1 and the pn junction with the n⁻ low-concentration diffusion region 6-2 make contact with each other before the pn junctions peripheral to the p-type isolation diffusion region 5 suffer avalanche breakdown. By setting the width and/or impurity concentration of each diffusion region in this way, the p-type isolation diffusion region 5 is depleted, the potential of the p-type isolation diffusion region 5 is raised to a potential close to the reference potential VS, and therefore the potential difference of the pn junctions peripheral to the p-type isolation diffusion region 5 can be reduced and avalanche breakdown can be prevented. Furthermore, the width and/or impurity concentration of each diffusion region is set so as to avoid punch-through via the depletion layers which are connected inside the p-type isolation diffusion region 5 and so that the distribution of the potential in the portion where the depletion layers extend has an undulating shape in the direction of extension of the depletion layers.

Cases where the prevention of avalanche breakdown of the pn junctions peripheral to the p-type isolation diffusion region 5 is not taken into consideration are those where, if the p-type isolation diffusion region 5 assumes the same potential as the p⁻⁻ substrate 1 and the power source potential VB and the reference potential VS are raised to approximately several hundred V, then an electric field will concentrate in the vicinity of the pn junctions peripheral to the p-type isolation diffusion region 5 and there is a risk of avalanche breakdown at these pn junctions peripheral to the p-type isolation diffusion region 5. Cases where the prevention of avalanche breakdown is not taken into consideration are those where the depletion layers extending inside the p-type isolation diffusion region 5 respectively from the pn junction with the n⁻ low-concentration diffusion region 6-1 and the pn junction with the n⁻ low-concentration diffusion region 6-2 do not make contact with each other, because the width of the p-type isolation diffusion region 5 (the distance between the n⁻ low-concentration diffusion region 6-1 and the n⁻ low-concentration diffusion region 6-2) becomes too great.

In other words, in order to suppress avalanche breakdown of the pn junctions peripheral to the p-type isolation diffusion region 5, the depletion layers which extend respectively inside the p-type isolation diffusion region 5 from the pn junction with the n⁻ low-concentration diffusion region 6-1 and the pn junction with the n⁻ low-concentration diffusion region 6-2 should make contact with each other. More specifically, provided that the depletion layers, which extend respectively inside the p-type isolation diffusion region 5 from the pn junctions with the n⁻ low-concentration diffusion region 6-1 and the n⁻ low-concentration diffusion region 6-2, make contact with each other at approximately the same depth as the depth of the n⁻ low-concentration diffusion regions 6-1, 6-2, then these depletion layers do not need to make contact on the front surface side of the substrate. Since the depletion layers, which extend respectively inside the p-type isolation diffusion region 5 from the n⁻ low-concentration diffusion region 6-1 and the n⁻ low-concentration diffusion region 6-2, make contact with each other at least at approximately the same depth as the depth of the n⁻ low-concentration diffusion regions 6-1, 6-2, then the potential of the p-type isolation diffusion region 5 is raised up to a potential near the reference potential VS, and therefore avalanche breakdown of the pn junctions peripheral to the p-type isolation diffusion region 5 can be suppressed.

The n⁻ low-concentration diffusion regions 6-1, 6-2 have the function of making it easier to suppress the occurrence of avalanche breakdown at the pn junctions peripheral to the p-type isolation diffusion region 5, due to concentration of electric field in the vicinity of the pn junction between the p-type isolation diffusion region 5 and the n⁻ low-concentration diffusion region 6-1 and in the vicinity of the pn junction between the p-type isolation diffusion region 5 and the n⁻ low-concentration diffusion region 6-2, when the power source potential VB and the reference potential VS rise to approximately several hundred V. The p-type isolation diffusion region 5 and the first and second n diffusion regions 2, 3 should be provided under conditions whereby the depletion layers extending respectively inside the p-type isolation diffusion region 5 from the pn junction with the n⁻ low-concentration diffusion region 6-1 and the pn junction with the n⁻ low-concentration diffusion region 6-2 contact each other, at least partially, but the n⁻ low-concentration diffusion regions 6-1, 6-2 do not have to be provided as illustrated in FIG. 8. The depletion layers may make contact with each other while the reference potential VS is raised to approximately several hundred V with respect to the GND potential. The voltage at the start of contact may be set to approximately 100 V.

In the high-voltage isolation region 11, an n⁻ low-concentration diffusion region 7 is provided on the surface layer on the front surface of the p⁻⁻ substrate 1 so as to surround the periphery of the high-side region 10. The n⁻ low-concentration diffusion region 7 lies in contact with the first and second n diffusion regions 2, 3. A MOSFET for a level shifter (not illustrated) is provided in the n⁻ low-concentration diffusion region 7. A high-voltage isolation region 11 is constituted by this n⁻ low-concentration diffusion region 7. When the potential of the high-side region 10 is raised to a high voltage of 600 V or above, compared to the low-side region 12, then the pn junction between the n⁻ low-concentration diffusion region 7 and a p⁻ low-concentration diffusion region 8 becomes reverse-biased and the voltage tolerance of the high-voltage IC 100 is maintained.

Furthermore, a p⁻ low-concentration diffusion region 8 which surrounds the periphery of the n⁻ low-concentration diffusion region 7 and contacts the n⁻ low-concentration diffusion region 7 is provided on the surface layer of the front surface of the p⁻⁻ substrate 1. The low-side region 12 is the portion apart from the high-side region 10, the high-voltage isolation region 11 and the level shifter. The p⁻ low-concentration diffusion region 8 is connected to the GND terminal at the ground potential GND via a contact electrode 8b. The p⁻ low-concentration diffusion region 8 has a function of fixing the p⁻⁻ substrate 1 to ground potential GND.

Although the values are not limited in particular, the surface impurity concentration and the diffusion depth of the first and second n diffusion regions 2, 3, the p diffusion region 4, the p-type isolation diffusion region 5, the n⁻ low-concentration diffusion regions 6-1, 6-2, 7 and the p⁻ low-concentration diffusion region 8 have the following values. The first and second diffusion regions 2, 3 may contain phosphorus (P) as a dopant, and the surface impurity concentration thereof may be approximately $1\times10^{15}/cm^3$ to $1\times10^{18}/cm^3$, and the diffusion depth thereof may be approximately 7 μm to 10 μm. The p diffusion region 4 may contain boron (B) as a dopant, and the surface impurity concentration thereof may be approximately $1\times10^{15}/cm^3$ to $1\times10^{19}/cm^3$, and the diffusion depth thereof may be approximately 4 μm to 6 μm. The p-type isolation diffusion region 5 and the p⁻ low-concentration diffusion region 8 may contain boron as a dopant, and the surface impurity concentration thereof may be approximately $1\times10^{15}/cm^3$ to $4\times10^{18}/cm^3$, and the diffusion depth thereof may be approximately 10 μm to 13 μm. The n⁻ low-concentration diffusion regions 6-1, 6-2 may contain phosphorus as a dopant, and the surface impurity concentration thereof may be approximately $1\times10^{15}/cm^3$ to $1\times10^{17}/cm^3$, and the diffusion depth thereof may be approximately 4 μm to 10 μm.

(Second Embodiment)

Figure 4:
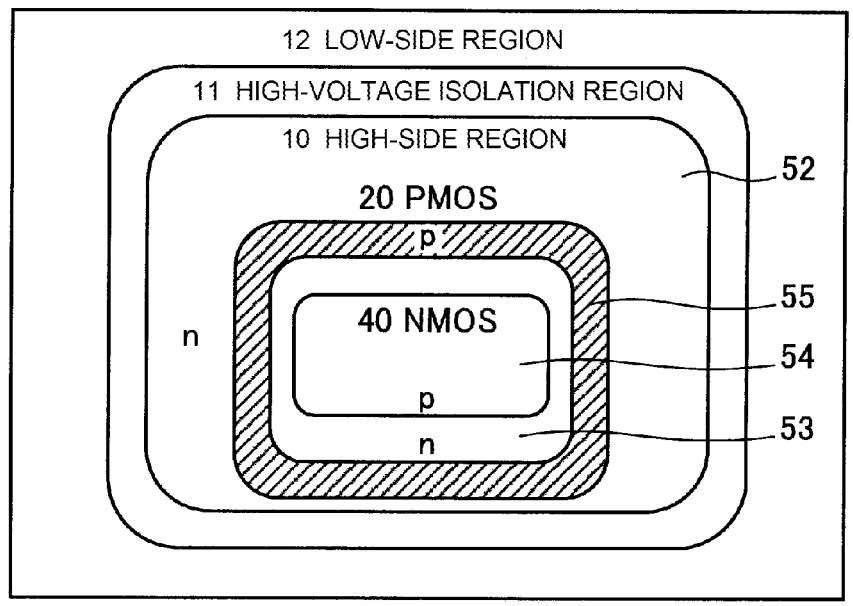
FIG. 4 is a plan diagram showing a schematic view of the plan structure of a high-voltage IC according to a second embodiment.

Next, a semiconductor device according to a second embodiment will be described. FIG. 4 is a plan diagram showing a schematic view of the plan structure of a high-voltage IC according to the second embodiment. The semiconductor device according to the second embodiment differs from the semiconductor device according to the first embodiment in terms of the plan layout of the first and second n diffusion regions and the p-type isolation diffusion region within the high-side region 10. More specifically, the semiconductor device according to the second embodiment differs from the semiconductor device according to the first embodiment in that, in the n diffusion region which constitutes the high-side region 10, a p-type isolation diffusion region 55 is arranged so as to surround the periphery of the portion where a p diffusion region 54 connected to the VS terminal is provided.

More specifically, a p-type isolation diffusion region 55 which has an approximate square ring shape, for example, is provided in the n diffusion region constituting the high-side region 10, separately from the n– low-concentration diffusion region 7 which constitutes the high-voltage isolation region 11. In the n diffusion region constituting the high-side region 10, the portion to the outside of the p-type isolation diffusion region 55 (in other words, the portion sandwiched between the p-type isolation diffusion region 55 and the n– low-concentration diffusion region 7) is a first n diffusion region 52, which is connected to the VB terminal, and the portion surrounded by the p-type isolation diffusion region 55 is a second n diffusion region 53 which is connected to a terminal at the reference potential VS or a floating potential. A PMOS 20 is arranged in the first n diffusion region 52 and outside of the p-type isolation diffusion region 55. A p diffusion region 54 where the NMOS 40 is arranged is provided in the second n diffusion region 53, which is surrounded by the p-type isolation diffusion region 55.

(Third Embodiment)

Figure 5:
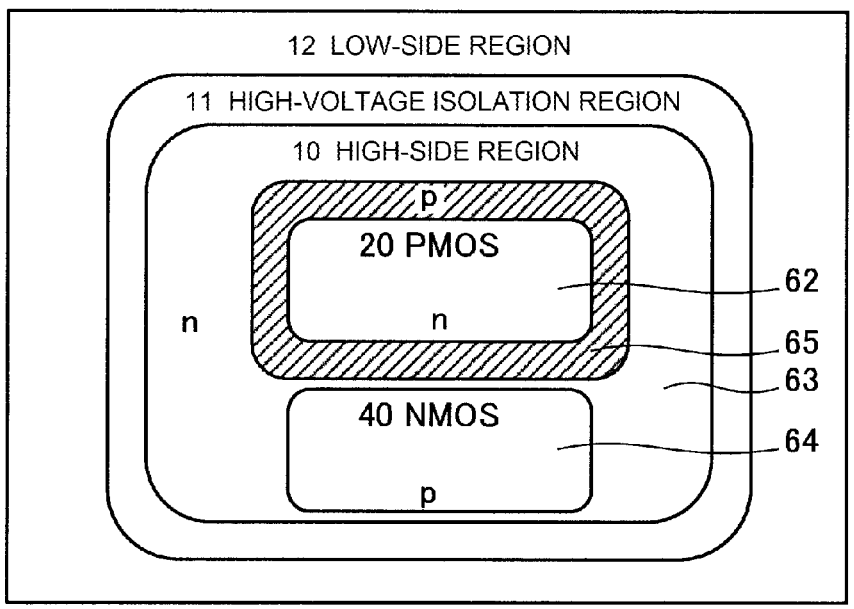
FIG. 5 is a plan diagram showing a schematic view of the plan structure of a high-voltage IC according to a third embodiment.

Next, a semiconductor device according to a third embodiment will be described. FIG. 5 is a plan diagram showing a schematic view of the plan structure of a high-voltage IC according to the third embodiment. The semiconductor device according to the third embodiment differs from the semiconductor device according to the first embodiment in terms of the plan layout of the first and second n diffusion regions and the p-type isolation diffusion region within the high-side region 10. More specifically, the semiconductor device according to the third embodiment differs from the semiconductor device according to the first embodiment in that, in the n diffusion region which constitutes the high-side region 10, a p-type isolation diffusion region 65 is arranged so as to surround the periphery of a portion connected to the VB terminal.

More specifically, a p-type isolation diffusion region 65 which has an approximate square ring shape, for example, is provided in the n diffusion region constituting the high-side region 10, separately from the n⁻ low-concentration diffusion region 7 which constitutes the high-voltage isolation region 11. In the n diffusion region constituting the high-side region 10, the portion surrounded by the p-type isolation diffusion region 65 is a first n diffusion region 62 which is connected to the VB terminal, and the portion outside of the p-type isolation diffusion region (in other words, the portion sandwiched between the p-type isolation diffusion region 65 and the n⁻ low-concentration diffusion region 7) is a second n diffusion region 63 which is connected to a terminal at the reference potential VS or a floating potential. A PMOS 20 is arranged in the first n diffusion region 62, which is surrounded by the p-type isolation diffusion region 65. A p diffusion region 64 where the NMOS 40 is arranged is provided in the second n diffusion region 63 which is to the outside of the p-type isolation diffusion region 65.

(Fourth Embodiment)

Figure 6:
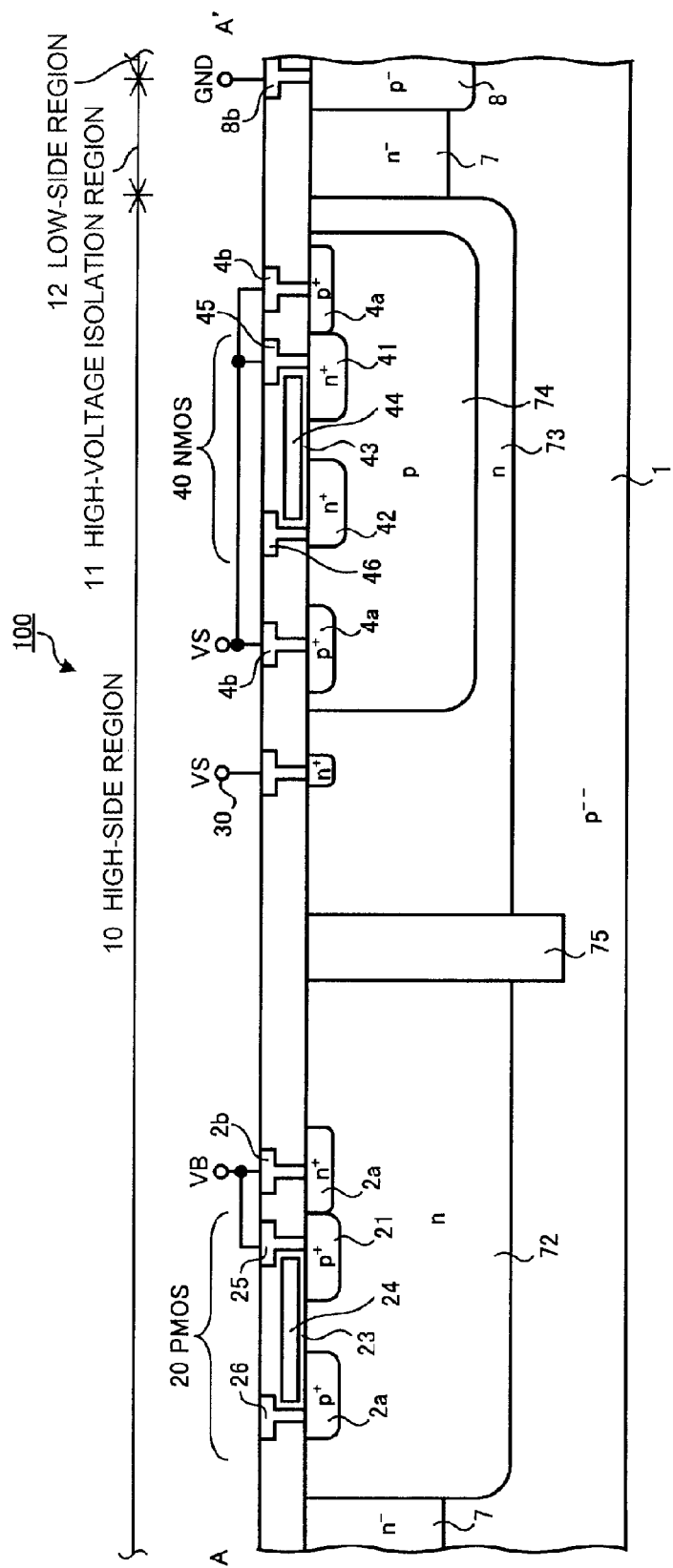
FIG. 6 is a cross-sectional diagram showing a schematic view of the cross-sectional structure of a high-voltage IC according to a fourth embodiment.

Next, a semiconductor device according to a fourth embodiment will be described. FIG. 6 is a cross-sectional diagram showing a schematic view of the cross-sectional structure of a high-voltage IC according to the fourth embodiment. FIG. 6 shows a cross-sectional structure along cross-section A-A' in FIG. 2. The semiconductor device according to the fourth embodiment differs from the semiconductor device according to the first embodiment in that a first n diffusion region 72 and a second n diffusion region 73 are isolated by an insulator layer (isolation region) 75 buried in a trench (DTI: Deep Trench Isolation). In other words, an insulator layer 75 is provided instead of the p-type isolation diffusion region.

More specifically, an n diffusion region constituting a high-side region 10 is provided on the surface layer on the front surface of the p⁻⁻ substrate 1. A trench is formed so as to pass in the depth direction through the n diffusion region constituting the high-side region 10 and reach to the p⁻⁻ substrate 1, and an insulator layer 75 is buried inside this trench. The insulator layer 75 is made from an oxide film or polysilicon, for example. The n diffusion region constituting the high-side region 10 is isolated by the insulator layer 75, between a first n diffusion region 72 to which the VB terminal is connected and a second n diffusion region 73 which is connected to a terminal 30 at the reference potential VS or a floating potential.

The PMOS 20 is formed in the first n diffusion region 72. A p diffusion region 74 connected to the VS terminal is provided inside the second n diffusion region 73. An NMOS 40 is formed in the p diffusion region 74. The plan layout of the first and second n diffusion regions 72, 73 and the insulator layer 75 within the high-side region 10 can be changed in various ways; for instance, the insulator layer 75 may be arranged so as to surround the periphery of the second n diffusion region 7 where the p diffusion region 74 connected to the VS terminal is provided, as in the second embodiment, or the insulator layer 75 may be arranged so as to surround the periphery of the first n diffusion region 72 connected to the VB terminal, as in the third embodiment.

Next, the operation of the high-voltage IC 100 according to the present disclosure is described with reference to an example for driving the first MOSFET 101 on the high side of the power conversion bridge circuit. The basic operation of the high-voltage IC 100 is similar to that of a conventional high-voltage IC. More specifically, the control circuit 115 operates by taking the ground potential GND as a reference, receives input of a gate control signal, and generates an on/off control signal referenced to GND, for switching the first MOSFET 101 on and off. This low-side-level on/off control signal is converted to an on/off control signal referenced to VS, by the level shifter 114, and is transmitted to the high-side drive circuit 110.

The on/off signal input to the high-side drive circuit 110 is input to the gate of the first MOSFET 101 via the gate drive circuit 111. The first MOSFET 101 is switched on and off on the basis of this on/off signal. Due to the first MOSFET 101 switching on and off on the basis of the on/off signal from the control circuit 115 transmitted via the level shifter 114 in this way, the potential of the VS terminal (reference potential VS) varies from 0 V to several hundred V in combination with the on/off switching of the second MOSFET 102. The high-voltage IC 100 operates by taking, as a reference, the reference potential VS, which is approximately 400 V, for instance, higher than the ground potential GND.

A parasitic pnp bipolar transistor in which the p diffusion region 4 is the emitter (reference potential VS), the first n diffusion region 2 is the base (power source potential VB), and the p$^{--}$ substrate 1 is the collector (ground potential GND), or a parasitic pnp bipolar transistor in which the p diffusion region 4 is the emitter (reference potential VS), the second n diffusion region 3 is the base (reference potential VS or floating potential), and the p$^{--}$ substrate 1 is the collector (ground potential GND), is formed in the high-side region 10 of the gate drive circuit 111 of the high-voltage IC 100, but when the high-voltage IC 100 is operating, even if the power source potential VB falls below the reference potential VS due to the application of a negative voltage surge (current generated by a transient abnormal voltage), these parasitic pnp bipolar transistors do not operate. The reason for this is as follows.

Since the first n diffusion region 2 and the second n diffusion region 3 are electrically isolated by the p-type isolation diffusion region 5, then the emitter (p diffusion region 4) and the base (first n diffusion region 2) of the parasitic pnp bipolar transistor in which the first n diffusion region 2 is the base are electrically isolated by the p-type isolation diffusion region 5. Therefore, virtually no current flows between the p diffusion region 4 and the p$^{--}$ substrate 1 (between the emitter and collector of the parasitic pnp bipolar transistor using the first n diffusion region 2 as a base, in other words, between the VS terminal and the GND terminal) (FIG. 7).

Figure 7:
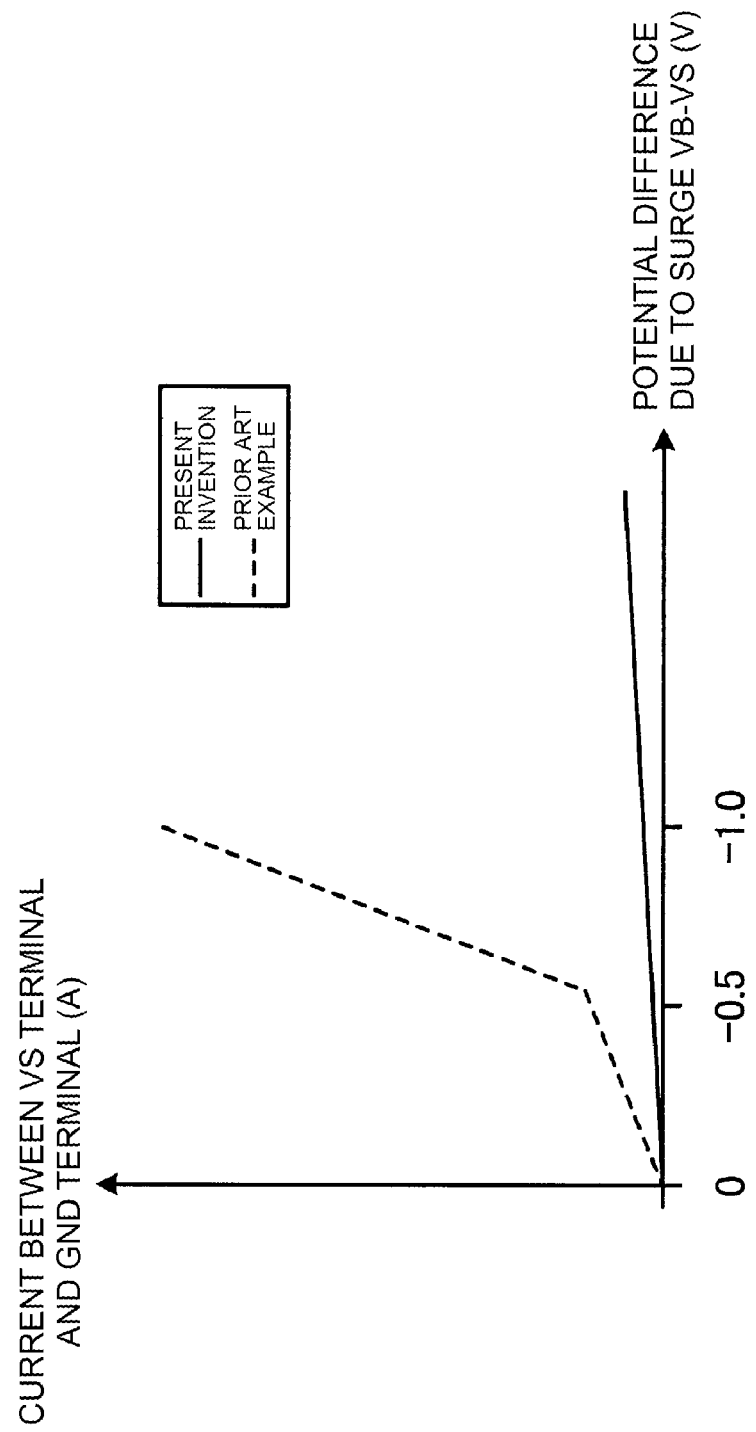
FIG. 7 is a graph showing the negative voltage surge-current characteristics of a high-voltage IC according to the present disclosure.

FIG. 7 is a graph showing the negative voltage surge-current characteristics of a high-voltage IC according to the present disclosure. In other words, the operation of a parasitic pnp bipolar transistor in which the first n diffusion region 2 is a base is suppressed by the p-type isolation diffusion region 5.

Furthermore, since the first n diffusion region 2 and the second n diffusion region 3 are electrically isolated by the p-type isolation diffusion region 5, and the second n diffusion region 3 is at the reference potential VS, then the emitter (p diffusion region 4) and the base (second n diffusion region 3) of the parasitic pnp bipolar transistor in which the second n diffusion region 3 is the base have the same potential. Furthermore, when the second n diffusion region 3 is at a floating potential, then the base (second n diffusion region 3) of the parasitic pnp bipolar transistor in which the second n diffusion region 3 is the base assumes a potential that is approximately 0.6 V, namely, the diffusion potential of a silicon pn junction, higher than the emitter potential (reference potential VS). Therefore, the parasitic pnp bipolar transistor in which the second n diffusion region 3 is the base does not operate since the pn junction between the emitter and the base is not forward-biased.

Figure 10:
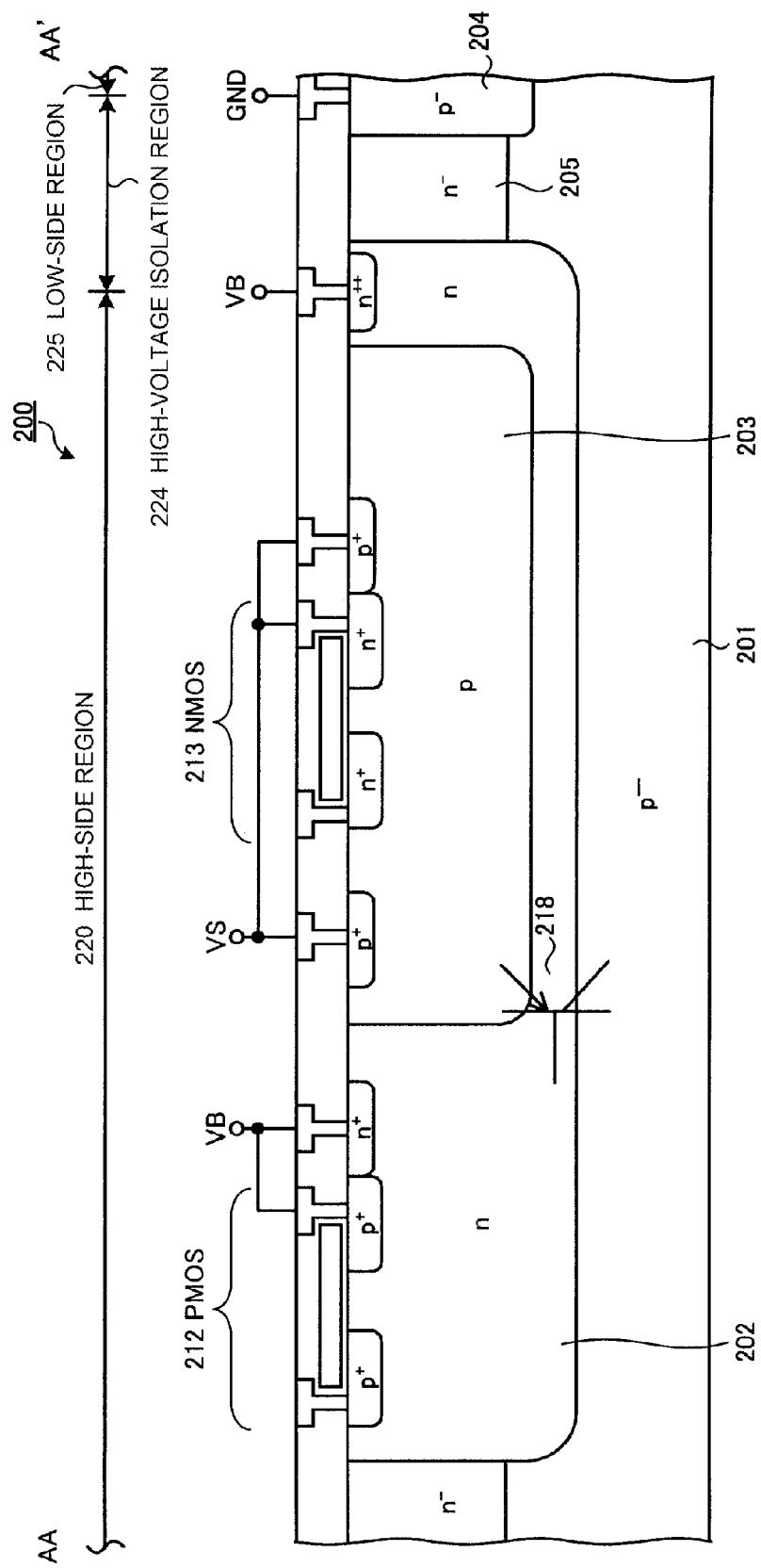
FIG. 10 is a cross-sectional diagram showing a cross-sectional structure along cross-section AA-AA' in FIG. 9.
Figure 11:
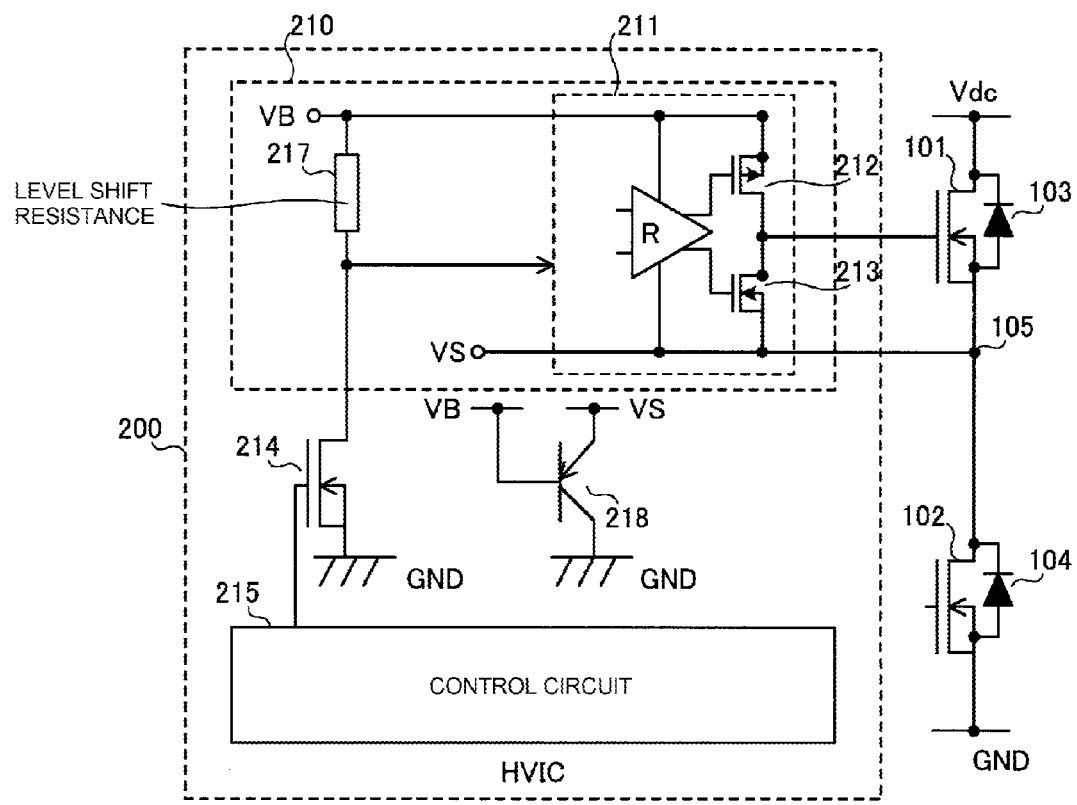
FIG. 11 is a circuit diagram showing an equivalent circuit of the high-voltage IC in FIG. 10.

Furthermore, since the p diffusion region 4 is fixed to the reference potential VS, then no problem occurs if the NMOS 40 formed in the p diffusion region 4 is used as a constituent part of the gate drive circuit 111. In FIG. 7, the horizontal axis is the potential difference between the VB terminal and the VS terminal when a negative voltage surge is applied (=VB−VS), and the vertical axis is the current flowing between the VS terminal and the GND terminal. The prior art example in FIG. 7 is a conventional high-voltage IC 200 in which the p-type isolation diffusion region 5 shown in FIG. 10 is not provided. It can be seen that, in the prior art example, when the power source potential VB has fallen below the reference potential VS, current flows between the emitter and the collector of the parasitic pnp bipolar transistor 218 as shown in FIG. 10 in which the p diffusion region 203 is the emitter, the n diffusion region 202 is the base, and the p$^{--}$ substrate 201 is the collector.

Furthermore, in the prior art high-voltage IC 200, when the first MOSFET 101 of the power conversion bridge circuit is switched so as to transfer from an off state to an on state, if the dV/dt noise of the positive voltage corresponding to this switching of the first MOSFET 101 (for example, noise of approximately 50 kV/μs) is applied to the VS terminal, then a pinch resistance is formed due to the depletion layer extending from the pn junction between the p diffusion region 203 and the n diffusion region 202, and a voltage fall occurs when the displacement current generated by the depletion flows through the pinch resistance. If the voltage fall due to this displacement current exceeds the potential difference (approximately +15 V) between the p diffusion region 203 and the n diffusion region 202, which are reverse-biased, then the parasitic pnp bipolar transistor 218 operates. On the other hand, in the present disclosure, since the first n diffusion region 2 and the second n diffusion region 3 are electrically isolated by the p-type isolation diffusion region 5, and the pinch resistance can be made small by setting the second n diffusion region 3 to the reference potential VS or the floating potential, then it is possible to suppress parasitic operation due to the dV/dt noise. When the second n diffusion region 3 is fixed to the reference potential VS, then the effect of suppressing parasitic operation due to the dV/dt noise is obtained to a greater extent.

As described above, according to the respective embodiments, since the first n diffusion region, which is connected to the VB terminal at the power source potential, and the second n diffusion region, which is connected to the VS terminal at the reference potential, are electrically isolated by the p-type isolation diffusion region, and the second n diffusion region is connected to a terminal at the reference potential, or a floating potential, then even if the power source potential VB falls below the reference potential VS due to the application of a negative voltage surge, the parasitic pnp bipolar transistor, in which the p diffusion region is the emitter (reference potential), the first n diffusion region is the base (power source potential) and the p⁻⁻ substrate is the collector (ground potential), does not operate. Therefore, it is possible to prevent element breakdown due to a negative voltage surge, without using external components, such as a bypass capacitor, or the like. Consequently, it is possible to provide an inexpensive high-voltage IC having strong resistance to surges, which is manufactured by an IC process based on self-isolation technology that does not require a special element isolation process, using inexpensive bulk substrates. Furthermore, by arranging the p-type isolation diffusion region in a straight line shape as in the first embodiment, it is possible to reduce the surface area occupied by the p-type isolation diffusion region. Furthermore, by arranging the p-type isolation diffusion region in a substantially square ring shape as in the second and third embodiments, the layout of the elements which are arranged in the high-side region is simplified.

The present disclosure was described above by an example of a gate drive circuit which drives a first MOSFET on the high side of a bridge circuit, but the disclosure is not limited to the embodiments described above and can also be applied to circuits having various configurations in which a PMOS and an NMOS are provided on the same substrate. Furthermore, the respective embodiments were described by an example of a high-voltage IC using a self-isolated IC process, but the disclosure can also be applied to a high-voltage IC manufactured using an epitaxial substrate. In this case, for example, a p diffusion region, which passes through the n epitaxial layer in the depth direction and reaches to the p-type semiconductor substrate is formed in an n epitaxial layer of an epitaxial substrate in which the n epitaxial layer is layered on top of the p-type semiconductor substrate, and the n epitaxial layer, which is isolated by the p diffusion region may be taken as a first and second n diffusion region. Furthermore, in the respective embodiments, a configuration is adopted in which only the PMOS and NMOS of a gate drive circuit are provided within the first and second n diffusion regions, but it is also possible to provide other constituent parts, which constitute a high-side drive circuit or constituent parts of a circuit other than a high-side drive circuit, within the first and second n diffusion regions. Moreover, the embodiments described above can also be established similarly even if the conductor types (n-type, p-type) of the semiconductor layer or semiconductor region are reversed.

As described above, the semiconductor device according to the present disclosure may be used in a power semiconductor device, which is used in a high-voltage IC having a medium-level parasitic capacitance of approximately 15 V to 24V, in particular, such as an inverter or other power conversion device, or a power source device for industrial machines of various kinds.

The invention claimed is:

1. A semiconductor device, comprising:
    a semiconductor layer of a first conductor type;
    a first semiconductor region of a second conductor type connected to a first potential, and disposed on a surface layer of the semiconductor layer, the semiconductor layer being connected to a third potential lower than the first potential;
    a second semiconductor region of the second conductor type connected to one of a second potential lower than the first potential and a floating potential, and disposed on the surface layer of the semiconductor layer;
    a third semiconductor region of the first conductor type connected to the second potential, and disposed inside the second semiconductor region;
    a circuit which takes the second potential as a reference potential and operates at a potential between the reference potential and the first potential, and the circuit being disposed in the first semiconductor region and the third semiconductor region;
    an isolation region, which is a semiconductor region of the first conductor type in contact with the first semiconductor region and the second semiconductor region, and electrically connected to the semiconductor layer, said isolation region being disposed between the first semiconductor region and the second semiconductor region, and electrically isolating the first semiconductor region from the second semiconductor region; and
    depletion layers respectively extending inside the isolation region from pn junctions between the isolation region, and the first semiconductor region and the second semiconductor region, the depletion layers connecting with each other when the second potential is higher than the third potential by a prescribed potential.

2. The semiconductor device according to claim 1, further comprising:
    a complementary metal-oxide semiconductor (CMOS) circuit disposed in the circuit, the CMOS circuit including
        a metal-oxide semiconductor field-effect transistor (MOSFET) in a channel of the first conductor type disposed in the third semiconductor region, and
        a MOSFET in a channel of the second conductor type disposed in the first semiconductor region.

3. The semiconductor device according to claim 1, wherein the second potential is lower than the first potential by 15V.

4. A semiconductor device, comprising:
    a semiconductor layer of a first conductor type;
    a first semiconductor region of a second conductor type connected to a first potential, and disposed on a surface layer of the semiconductor layer;
    a second semiconductor region of the second conductor type connected to one of a second potential lower than the first potential and a floating potential, and disposed on the surface layer of the semiconductor layer, separately from the first semiconductor region;
    a third semiconductor region of the first conductor type connected to the second potential, and disposed inside the second semiconductor region;
    a circuit which takes the second potential as a reference potential and operates at a potential between the reference potential and the first potential, the circuit being provided in the first semiconductor region and the third semiconductor region;
    an isolation region of the first conductor type; and
    depletion layers respectively extending inside the isolation region from pn junctions between the isolation region, and the first semiconductor region and the second semiconductor region, the depletion layers connecting with each other when the second potential is higher than a third potential by a prescribed potential,
    wherein the third potential is lower than the first potential and connected to the semiconductor layer.

5. The semiconductor device according to claim 4, wherein the isolation region is a semiconductor region of the first conductor type which is in contact with the first semiconductor region and the second semiconductor region, and is electrically connected to the semiconductor layer.

6. The semiconductor device according to claim 4, wherein the circuit comprises a gate drive circuit which drives a first transistor of an external circuit in which the first transistor on a high-potential side and a second transistor on a low-potential side are connected.

7. The semiconductor device according to claim 6, wherein the external circuit is a power bridge circuit.

8. The semiconductor device according to claim 4, wherein the third potential is a ground potential.

9. A semiconductor device, comprising:
- a semiconductor layer of a first conductor type;
- a first semiconductor region of a second conductor type connected to a first potential, and disposed on the semiconductor layer;
- a second semiconductor region of the second conductor type connected to one of a second potential and a floating potential, and disposed on the semiconductor layer, the semiconductor layer being connected to a third potential lower than the first potential;
- a third semiconductor region of the first conductor type connected to the second potential, and disposed inside the second semiconductor region;
- an isolation region electrically isolating the first semiconductor region from the second semiconductor region; and
- depletion layers respectively extending inside the isolation region from pn junctions between the isolation region of the first semiconductor type, and the first semiconductor region and the second semiconductor region, the depletion layers connecting with each other when the second potential is higher than the third potential by a prescribed potential.

10. The semiconductor device according to claim 9, wherein current does not flow between the third semiconductor region and the semiconductor layer in response to the first potential falling below the second potential.

11. The semiconductor device according to claim 9, wherein the isolation region is in contact with the first semiconductor region and the second semiconductor region, and electrically isolates the first semiconductor region from the second semiconductor region.

12. A semiconductor device, comprising:
- a semiconductor layer of a first conductor type,
- a first semiconductor region of a second conductor type connected to a first potential, and disposed on the semiconductor layer;
- a second semiconductor region of the second conductor type connected to one of a second potential and a floating potential, and disposed on the semiconductor layer;
- a third semiconductor region of the first conductor type connected to the second potential, and disposed inside the second semiconductor region;
- a circuit including a gate drive circuit that drives a first transistor of an external circuit in which the first transistor on a high-potential side and a second transistor on a low-potential side are connected, the circuit that includes the gate drive circuit being disposed in the first semiconductor region and the third semiconductor region; and
- an isolation region electrically isolating the first semiconductor region from the second semiconductor region.

13. The semiconductor device according to claim 12, wherein the isolation region comprises:
- a trench between the first semiconductor region and the second semiconductor region, the trench passing through the first semiconductor region and the second semiconductor region and reaching the semiconductor layer; and
- an insulator layer buried inside the trench.

14. The semiconductor device according to claim 12, wherein the second potential is the potential of a contact point between the first transistor and the second transistor.

15. The semiconductor device according to claim 12, wherein the semiconductor layer is connected to a third potential lower than the first potential, further comprising:
- depletion layers respectively extending inside the isolation region from pn junctions between the isolation region of the first conductor type, and the first semiconductor region and the second semiconductor region, the depletion layers connecting with each other when the second potential is higher than the third potential by a prescribed potential.

* * * * *